(12) United States Patent  
Kim et al.

(10) Patent No.: US 8,111,563 B2
(45) Date of Patent: Feb. 7, 2012

(54) MULTI-LEVEL NONVOLATILE MEMORY DEVICE WITH FAST EXECUTION OF PROGRAM SPEED AND PROGRAMMING METHOD OF THE SAME

(75) Inventors: Ho-Jung Kim, Suwon-si (KR); Sang-Beom Kang, Hwaseong-si (KR); Chul Woo Park, Yongin-si (KR); Hyun Ho Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 91 days.

(21) Appl. No.: 12/659,473

(22) Filed: Mar. 10, 2010

(65) Prior Publication Data
US 2010/0246246 A1 Sep. 30, 2010

(30) Foreign Application Priority Data
Mar. 26, 2009 (KR) ........................ 10-2009-0025757

(51) Int. Cl.
*G11C 7/00* (2006.01)
(52) U.S. Cl. ..................... 365/189.16; 365/148; 365/163
(58) Field of Classification Search .................. 365/148, 365/163, 189.16, 189.15
See application file for complete search history.

(56) References Cited

U.S. PATENT DOCUMENTS

| 6,545,906 | B1 | 4/2003 | Savtchenko et al. |
| 6,625,054 | B2 | 9/2003 | Lowrey et al. |
| 6,646,912 | B2 | 11/2003 | Hurst et al. |
| 6,849,891 | B1 | 2/2005 | Hsu et al. |
| 7,031,185 | B2 | 4/2006 | Perner et al. |
| 7,031,188 | B2 * | 4/2006 | Lee et al. ................ 365/185.04 |
| 7,257,032 | B2 | 8/2007 | Fujiu et al. |
| 7,282,759 | B2 | 10/2007 | Kim et al. |
| 7,287,259 | B2 | 10/2007 | Grier et al. |
| 7,304,885 | B2 | 12/2007 | Cho et al. |
| 7,372,725 | B2 | 5/2008 | Philipp et al. |
| 7,427,531 | B2 | 9/2008 | Cho et al. |
| 7,535,747 | B2 | 5/2009 | Lee et al. |
| 7,594,157 | B2 * | 9/2009 | Choi et al. ................ 714/764 |
| 2007/0041249 | A1 | 2/2007 | Lusky et al. |
| 2007/0211537 | A1 | 9/2007 | Park et al. |
| 2007/0217253 | A1 | 9/2007 | Kim et al. |
| 2008/0123389 | A1 | 5/2008 | Cho et al. |

(Continued)

FOREIGN PATENT DOCUMENTS
KR 10-2002-0092261 A 12/2002
(Continued)

OTHER PUBLICATIONS

Bedeschi, Ferdinando, et al., "A Bipolar-Selected Phase Change Memory Featuring Multi-Level Cell Storage", IEEE Journal of Solid-State Circuits, vol. 44, No. 1, pp. 217-227, (Jan. 2009).

*Primary Examiner* — Andrew Q Tran
(74) *Attorney, Agent, or Firm* — Lee & Morse, P.C.

(57) ABSTRACT

A nonvolatile memory device having a plurality of multi-level memory cells, the plurality being at least two, may be programmed by writing a least significant bit for each multi-level memory cell of the plurality of memory cells and, after the least significant bit has been written for each multi-level memory cell of the plurality of memory cells, writing a next significant bit for each multi-level memory cell.

20 Claims, 12 Drawing Sheets

U.S. PATENT DOCUMENTS

| | | |
|---|---|---|
| 2008/0137416 A1 | 6/2008 | Lee |
| 2008/0211036 A1 | 9/2008 | Zhao et al. |
| 2009/0040814 A1 | 2/2009 | Kang et al. |
| 2009/0073752 A1 | 3/2009 | Fackenthal et al. |
| 2009/0080242 A1 | 3/2009 | Resta et al. |
| 2009/0147563 A1 | 6/2009 | Happ et al. |
| 2009/0196092 A1 | 8/2009 | Jagasivamani et al. |

FOREIGN PATENT DOCUMENTS

| | | |
|---|---|---|
| KR | 10-0836762 B1 | 6/2008 |

* cited by examiner

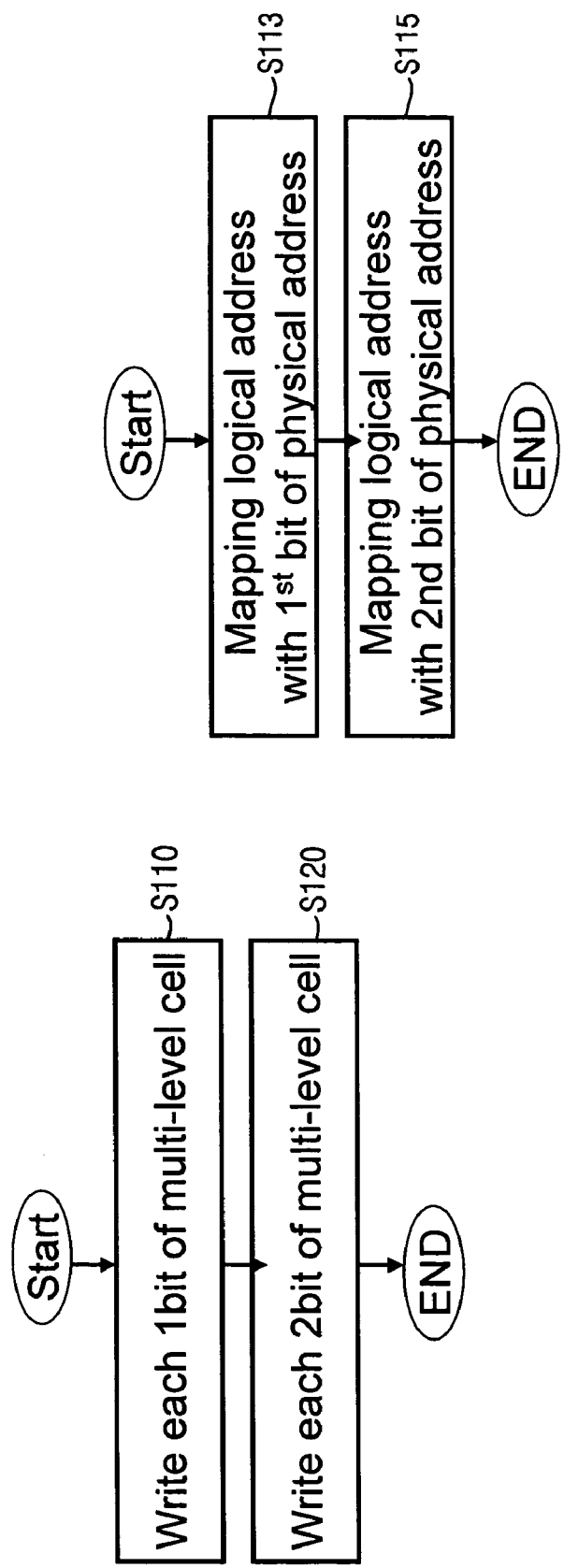

MULTI-LEVEL NONVOLATILE MEMORY DEVICE WITH FAST EXECUTION OF PROGRAM SPEED AND PROGRAMMING METHOD OF THE SAME

1. FIELD

Embodiments relate to a semiconductor device, and more particularly, to a semiconductor device which enables fast execution of a program speed, a semiconductor system having the same, and a method of programming a memory cell.

2. DESCRIPTION OF THE RELATED ART

Memories are divided into volatile memories and non-volatile memories. Dynamic random access memories (DRAMs) and static random access memories (SRAMs) are volatile memories, while and flash memories, resistive memories, and phase change memories are non-volatile memories. The resistive memory uses a resistance value of a memory device to store one or more bits of data.

An entire block of resistive memory cells cannot be programmed or erased simultaneously, as this would require too large a drive current. Accordingly, a block of such memory cells is programmed sequentially by applying a series of program pulses to respective cells. However, this results in a long programming time.

SUMMARY

Embodiments are therefore directed to memory device, a system having the same, and a method of programming a memory cell, which substantially overcome one or more of the problems of the related art.

It is therefore a feature of an embodiment to provide a memory device that enables fast execution of a program speed, a semiconductor system having the same, and a method of programming a memory cell.

It is therefore another feature of an embodiment to provide a memory device in which least significant bits of multi-level cells are written before next significant bits of multi-level cells are written.

At least one of the above and other features and advantages may be realized by providing a method of writing data to a nonvolatile memory device having a plurality of multi-level memory cells, the plurality being at least two, the method including writing a least significant bit for each multi-level memory cell of the plurality of memory cells and, after the least significant bit has been written for each multi-level memory cell of the plurality of memory cells, writing a next significant bit for each multi-level memory cell.

When the multi-level memory cells have more than two levels, the method may include finishing writing of all lower bits before writing higher bits, such that a most significant bit is written after all other bits have been written. When the multi-level memory cell is two-level memory cell, the next significant bit is the most significant bit. When "a" is a number of the plurality of multi-level memory cells, writing may include mapping logical addresses of data to a first through an a-th physical address corresponding to the least significant bits of the plurality of multi-level memory cells. After the a-th physical address has been written, writing may include mapping logical addresses of data to an (a+1)th through an (2a) physical address corresponding to next significant bits of the plurality of multi-level memory cells. Writing a most significant bit for n-level memory cells may include mapping logical addresses of data to an (a(n−1)+1)th through an (na) physical address corresponding to most significant bits of the plurality of multi-level memory cells.

The plurality of multi-level memory cells may include a block or a page of multi-level memory cells.

A distribution value of the least significant bit may be higher than a distribution value after writing the next significant bit.

Each multilevel memory cell may be a variable resistive memory cell. The variable resistive memory cell may be a phase change memory cell. Each phase change memory cell may include a cell diode.

The plurality of multi-level memory cells may be a subset of all multi-level memory cells in the non-volatile memory device. The subset may be completely written before other multi-level memory cells are written. The subset may be, e.g., a page or a block.

At least one of the above and other features and advantages may be realized by providing a multi-level non-volatile memory device, including a plurality of multi-level memory cells, the plurality being at least two, and a controller configured to write a least significant bit for each multi-level memory cell of the plurality of multi-level memory cells and, after the least significant bit has been written for each multi-level memory cell of the plurality of multi-level memory cells, to write a next significant bit for each multi-level memory cell.

Each multi-level memory cell may be a variable resistive memory cell. The variable resistive memory cell may be a phase change memory cell. Each phase change memory cell may include a cell diode.

The plurality of multi-level memory cells may be a subset of all multi-level memory cells in the non-volatile memory device. The subset may be completely written before other multi-level memory cells are written. The subset may be, e.g., a page or a block.

When the multi-level cell has more than two levels, the controller may be configured to finish writing of all lower bits before writing higher bits, such that a most significant bit is written after all other bits have been written. When "a" is a number of the plurality of multi-level memory cells, the controller may be configured to map logical addresses of data to a first through an a-th physical address corresponding to the least significant bits of the plurality of multi-level memory cells. When the multi-level memory cells are n-level memory cells, the controller may be configured to map logical addresses of data to an (a(n−1)+1)th through an (na) physical address corresponding to most significant bits of the plurality of n-level memory cells.

The controller may be configured to map logical addresses using a translation layer. The translation layer may be in the controller.

At least one of the above and other features and advantages may be realized by providing a system, including a processor and a multi-level non-volatile memory device in accordance with embodiments.

BRIEF DESCRIPTION OF THE DRAWINGS

The above and other features and advantages of will become more apparent to those of ordinary skill in the art by describing in detail exemplary embodiments with reference to the attached drawings, in which:

FIGS. 3 and 4 illustrate flowcharts of a method in accordance with an embodiment;

DETAILED DESCRIPTION

Figure 1:
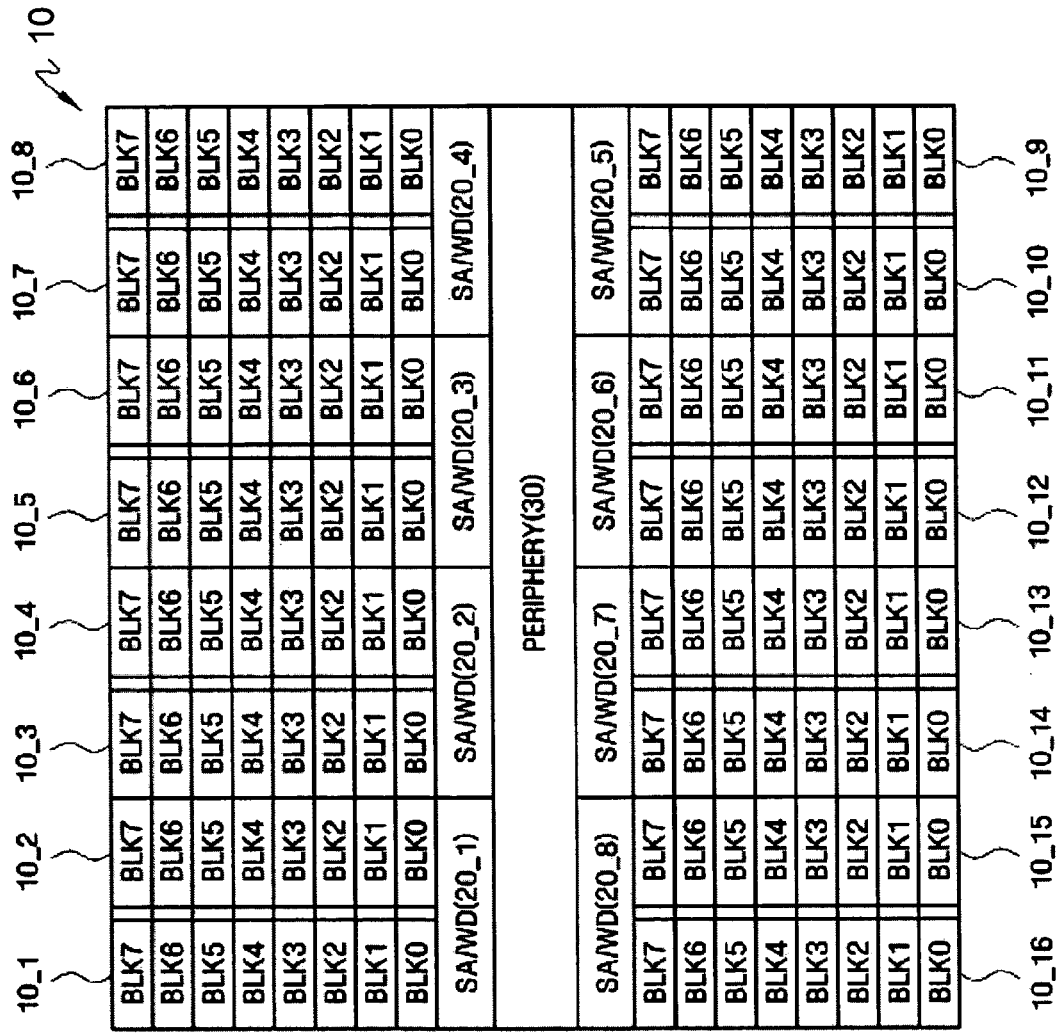
FIG. 1 illustrates a schematic view of a layout of a memory device.

Korean Patent Application No. 10-2009-0025757, filed on Mar. 26, 2009, in the Korean Intellectual Property Office, and entitled: "Resistive memory device, memory system including same, and programming method of the same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements/features throughout the specification.

Hereinafter, embodiments of the invention will be described using a phase change random access memory device (PRAM) example. However, it will be apparent to those skilled in the art that embodiments may be applied to other forms of nonvolatile memory using resistance materials, such as a resistive RAM (RRAM), and a ferroelectric RAM (FRAM). Herein, the terms "write" and "program" are used interchangeably in this written description to denote operations for storing data in one or more memory cells.

As illustrated in FIG. 1, a memory cell array 10 may include a plurality of memory banks, e.g., sixteen memory banks 10_1 to 10_16. Each bank 10_i may include a plurality of blocks BLK0 to BLK7. Each block BLKj may include a plurality of bit lines BL0 to BLn and a plurality of word lines WL0 to WLm. A memory cell is located at the intersection of bit and word lines. A sense amplifier and write driver SA/WD 20_i may be provided for a plurality of tiles or banks, i.e., all bit lines in a tile may be connected to a common SA/WD20_i. In this particular example, each SA/WD 20_i is connected to two banks, for a total eight SA/WD 20_1 to 20_8 in the memory cell array 10. The tiles may be grouped into planes, each plane including eight tiles. Two planes may form a partition. A peripheral circuit 30 may include logic to operate the SA/WD 20_i and a voltage generator, as described in detail later.

Figure 2:
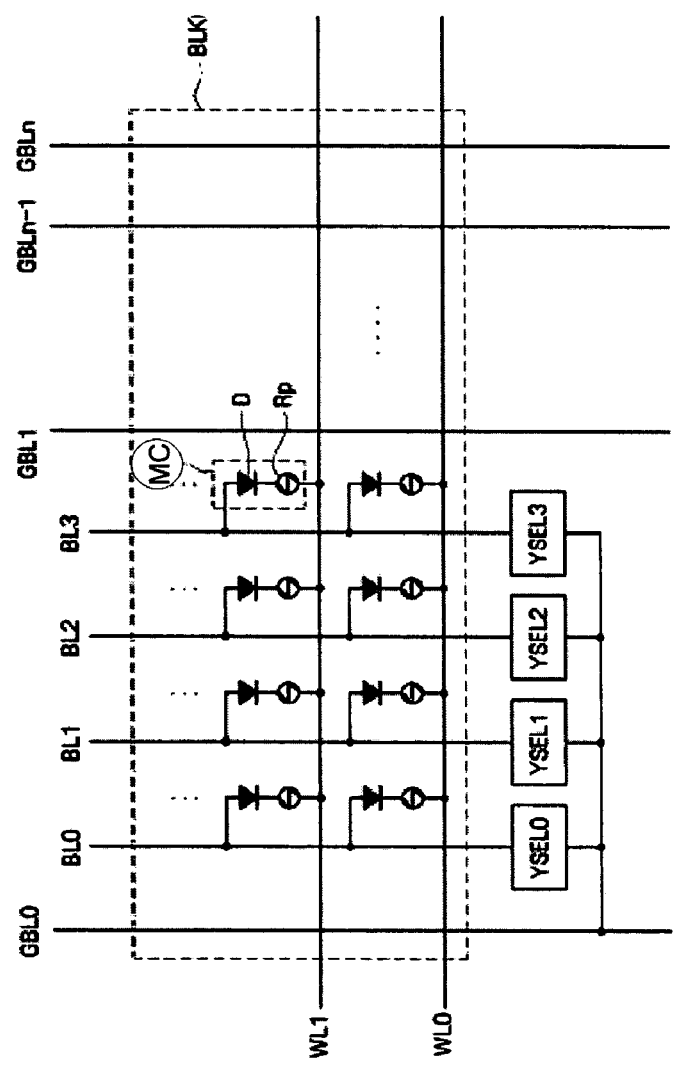
FIG. 2 illustrates a schematic diagram of an exemplary block of the memory device.

An example schematic of a block BLKi is illustrated in FIG. 2. As illustrated therein, each block BLKi may include a plurality of memory cells MC located at the intersection of a BL and a wordline WL. The memory cell MC may include a current control device D and a resistive element Rp. Each block BLKi may also include a plurality of global bitlines GBLi. In this particular example, each global bit line GBLi is associated with four bit lines BL0 to BL3. The global bitlines GBLi may control the bitlines associated therewith through corresponding transistors YSEL0 to YSEL3.

The word lines WLi may be responsive to a row address decoder (not shown) and the bit lines BLi may be selected responsive to a column address decoder (not shown). Such row and address decoders are well known in the art and need not be described further herein. As used herein, a word of data refers to the number of bits that are selected for a given output of the row address decoder and column address decoder (i.e. when a word line is active and a corresponding column select signal is active). Data may be sequentially applied to the SA/WD 20_i, such that fewer than all of the write drivers for a word of data are simultaneously active, which may reduce the peak current requirements when the memory cells are programmed.

Each of the resistive elements Rp may be embodied by a phase change random access memory (PRAM). The PRAM, which may be referred to as a PCRAM or an ovonic unified memory (OUM), may use a phase change material, for example, chalcogenide alloy, for the resistive elements Rp. The phase change material may have a different resistance value according to a crystalline state, an amorphous state, or an intermediate state (when more than 1-bit data is to be programmed). For example, the phase change material may be a material of a compound of two elements, for example, GaSb, InSb, InSe, $Sb_2Te_3$, or GeTe, a material of a compound of three elements, for example, GeSbTe, GaSeTe, InSeTe, $SnSb_2Te_4$, or InSbGe, or a material of a compound of four elements, for example, AgInSbTe, (GnSn)SbTe, GeSb(SeTe), or $Te_{81}Ge_{15}Sb_2S_2$. Additional details regarding structures of the resistive elements according to embodiments will be discussed below.

The current control device D may be a diode or a transistor, e.g., a metal-oxide-semiconductor field effect transistor (MOSFET) or a bipolar junction transistor (BJT).

While conventional resistive memory devices can receive several bits of input at the same time, they are unable to simultaneously program the bits into corresponding memory cells. For example, a resistive memory device may receive 16 inputs through a plurality of pins, the memory device may not be able to simultaneously access 16 memory cells. One reason for this shortcoming is that if a current of 1 mA is required to program one memory cell, then a current of 16 mA would be required to simultaneously program 16 memory cells. Moreover, if the efficiency of a write driver providing the current is 10%, then in reality, a current of 160 mA would be required to simultaneously program the 16 memory cells. However, conventional memory devices are generally not equipped to provide currents with such high magnitudes.

Thus, since a write driver can only provide a limited amount of current, a program operation of several memory cells may be divided into several "divisional program operations" each requiring only a fraction of the total current required to program all of the several memory cells. In each divisional program operation, a subset (i.e., a "division") of memory cells among a larger group is programmed. For example, a group of sixteen memory cells may be programmed by dividing the sixteen memory cells into eight groups (i.e., divisions) of two and simultaneously programming the two memory cells in each group of two in eight successive divisional program operations.

To prevent unnecessary current consumption and programming failures, the memory device may also perform a verify read operation to verify the program status of each selected memory cell. To perform the verify read operation, program data to be programmed in the selected memory cells may be stored in a temporary storage location, e.g., a program buffer. Next, the program data is programmed into selected cells. Then, the data stored in the selected memory cells may be read and compared with the program data stored in the temporary storage location. Where the data stored in the temporary storage location is different from the data stored in the selected memory cells, the verify read operation indicates a program failure. Otherwise, the verify read operation indicates a program success.

In the configuration illustrated in FIGS. 1 and 2, each block BLKi may have one selected cell selected simultaneously with cells in different block within the same bank. In other words, cells in the same block BLKi may be programmed sequentially from other memory cells in same block BLKi Conventionally, each multi-level cell is programmed before proceeding to program another multi-level cell. In accordance with embodiments, LSBs in all multi-level cells may be programmed before programming MSBs in any of the multi-level cells in any grouping of multi-level cells. Such grouping may include at least two multi-level cells up to an entirety of the multi-level cells in the memory.

FIG. 3 illustrates a flowchart of a program method according to an embodiment. Here, only two-level cells are assumed for ease of explanation. First, each least significant bit, e.g., a first bit, for each multi-level cell is written in operation S110. After first bits of all two-level cells have been written, the next significant bit, e.g., a second bit, for each multi-level cell is written in operation S120 until all data has been written to the two-level cells. If data is to be written to multi-level cell having more than two-levels, each less significant bit data is written before the next significant bit of the multi-level cells is written until, finally, the most significant bit of the multi-level cells is written, after which the operation is complete.

FIG. 4 illustrates a flowchart of a program method of operation S110 of FIG. 3 according to an embodiment. Here, it is assumed that only two-level cells are being written for ease of explanation. Writing includes mapping data from a logical address to a physical address of the least significant bit of a first two-level cell in operation S113 and then mapping data from a logical address to a physical address of the least significant bit of a second two-level cell in operation S113. Such writing continues until the least significant bits of all two-level cells have been written. Then, if more data is to be written, the writing continues to the most significant bit of the first two-level cell, and so forth.

Figure 5:
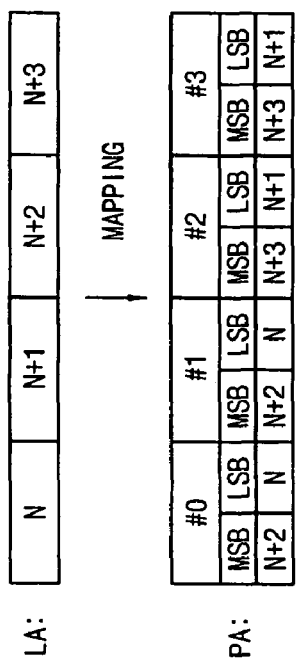
FIG. 5 illustrates a diagram of logical address to physical address mapping in accordance with an embodiment.

FIG. 5 illustrates mapping between logical addresses and physical addresses according to embodiments. Here, one physical address indicates a series of multilevel cells to store one word unit data. If a word has a length of 16 bits, then the bit values for the words may be stored in physical addresses as follows. All bit values that compose word N are stored to the eight LSB cells of physical address #0 and the eight LSB cells of physical address #1. All bit values that compose word N+1 are stored to the eight LSB cells of physical address #2 and the eight LSB cells of physical address #3. After all the LSB cells of the physical address have been written, the remaining data may be written to the next significant bit cells, e.g., the MSB cells. Thus, all bit values that compose word N+2 are stored to the eight MSB cells of physical address #1 and the eight MSB cells of physical address #0. All bit values that compose word N+3 are stored to eight MSB cells of physical address #2 and the eight MSB cells of physical address #3. Thus, program (input) data is written to LSB cells (the first bit) before being written to MSB cells (the second bit) of multi level memory cells. Thus, when only words N and N+1 are written, the operation may be very fast and reliable, as discussed in detail below.

Figure 6:
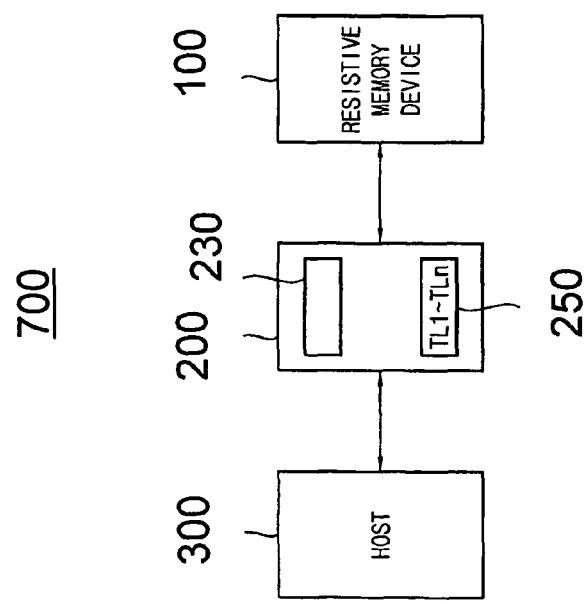
FIG. 6 illustrates a block diagram of a memory system including a memory device in accordance with an embodiment.

FIG. 6 illustrates a block diagram of an exemplary memory system 700 according to embodiments. As illustrated therein, the memory system 700 may include a resistive memory device 100, a memory controller 200, and a host 300. The memory controller 200 may include a control block 230 and a translation layer 250. Alternatively, the translation layer 250 may be in the resistive memory device 100.

When small data is to be programmed, the control block 230 may select page mapping translation. According to the chosen layer, logical addresses may be mapped using the first and second physical mappings. Thus, the controller 200 may write data to the resistive memory device 100 page by page. When large data is to be programmed, the control block 230 may select block mapping translation. Alternatively, the control block 230 may select other translation schemes, e.g., bank mapping translation, cell mapping translation, etc. Any desired plurality e.g., at least two, of multi-level cells, may be selected for the mapping translation.

In conventional programming, assuming writing to a two-level cell, first data, e.g., LSB of word N, would be mapped to a first physical address corresponding to a LSB of a first two-level cell, second data, e.g., MSB of word N, would be mapped to a second physical address corresponding to a MSB of the first two-level cell, third data, e.g., LSB of word N+1, would be mapped to a third physical address corresponding to a LSB of a second two-level cell, fourth data, e.g., MSB of word N+1 would be mapped to a fourth physical address corresponding to a MSB of the second two-level cell, fifth data, e.g., LSB of word N+2 would be mapped to a fifth physical address corresponding to a LSB of a third two-level cell, and so forth. In contrast, within a chosen mapping translation region, first data, e.g., LSB of word N, would be mapped to a first physical address corresponding to a LSB of a first two-level cell, second data, e.g., MSB of word N, would be mapped to a second physical address corresponding to a LSB of a second two-level cell, third data, e.g., LSB of word N+1, would be mapped to a third physical address corresponding to a LSB of a third two-level cell, fourth data, e.g., MSB of word N+1 would be mapped to a fourth physical address corresponding to a LSB of the fourth two-level cell, and so forth until all LSBs within the designated region have been programmed. Then, the MSBs would be programmed. For example, assuming four two-level cells are to be written, fifth data, e.g., LSB of word N+2 would be mapped to a fifth physical address corresponding to a MSB of the first two-level cell, and so forth. For example, if "a" is a number of the plurality of cells within the designated region, writing data would include mapping data from a logical address to a first through an a-th physical address corresponding to an LSB of each memory cell and then, once LSB of all a memory cells has been written, mapping data to next significant bits of the a plurality of memory cells to an (a+1)th through an (2a) physical address.

Figure 7:
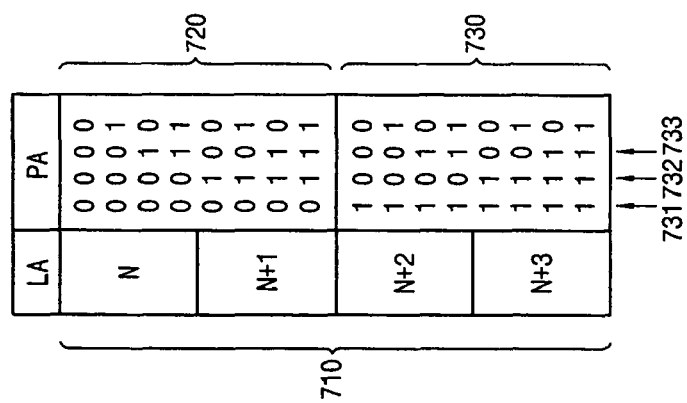
FIG. 7 illustrates a diagram of logical address to physical address mapping in accordance with an embodiment.

A particular example is illustrated in FIG. 7. Again, as discussed above with reference to FIG. 5, when four 16-bit words 710 are to be stored in two-level cells, the first two words N and N+1 may be stored at physical addresses corresponding to LSBs 710 of the two-level cells and the remaining two words N+2 and N+3 may be stored at physical addresses corresponding to MSBs 720 of the two-level cells. In a first bit 731, "0" represents LSB and "1" represents MSB. A block of memory may be designated using a second bit 732 and a page of data may be designated using a third bit 733.

Thus, within a chosen mapping translation, all LSBs may be written before In accordance with embodiments, regardless of the translation scheme employed, each LSB data may be written to the multi-level cell first. Thus, for writing to two-level cells, up to 50% of the memory capacity may be written very quickly.

Figure 8:
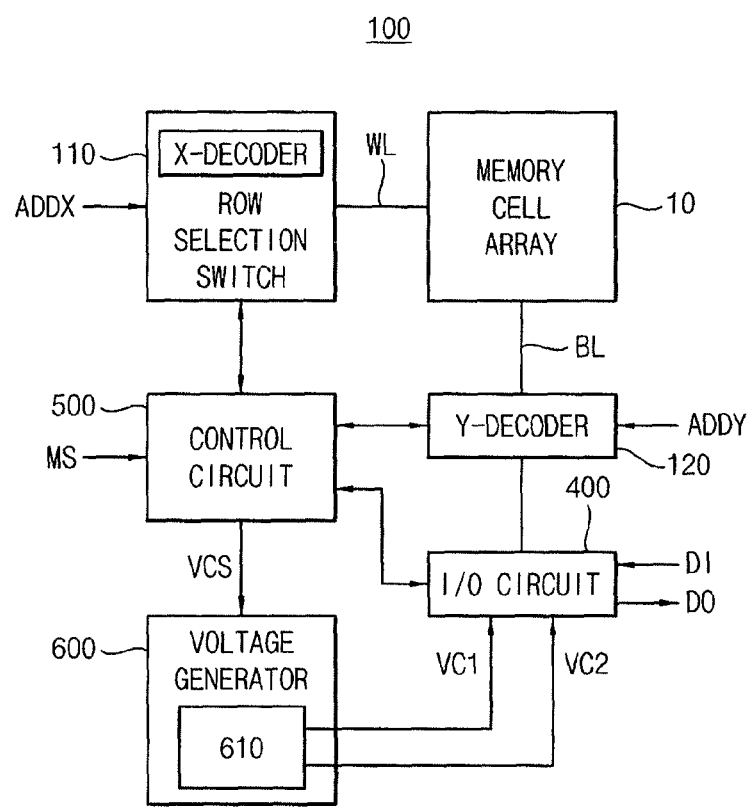
FIG. 8 illustrates a block diagram of a memory device according to an embodiment.

A detailed block diagram of the resistive memory device 100 is illustrated in FIG. 8. As shown therein, the resistive memory device 100 may include the memory cell array 10, a row selection block 110, a column decoder 120, an input/output (I/O) block 400, a control block 500, and a voltage generator 600. While FIG. 7 only shows a single wordline WL and bitline BL for ease of illustration, it is to be understood that respective memory cells within the memory cell array 10 are at an intersection of a corresponding plurality of wordlines and bitlines, and are selected in accordance therewith.

The row selection block 110 may include a row decoder configured to select a wordline WL in accordance with a row address ADDX for read or write operations. The row selection block 110 may also include a driver to insure a particular voltage for selected and unselected wordlines, respectively.

The column decoder 120 may be configured to select a bitline BL in accordance with a column address ADDY for read or write operations in accordance. Data to be read from or written to respective memory cells may be controlled by the I/O block 400, described in detail below.

The control block 500 may respond to a mode signal MS and may control operation of the I/O block 400. The mode signal MS may be supplied from outside or may be supplied internally by the control block 500 itself in accordance with an address signal ADDX, ADDY. In response to the mode signal MS, the control block 500 may output timing control signals to the row selection block 110, the column decoder 120, and the I/O block 400, and may output voltage control signals (VCS) to the voltage generator 600.

Figure 9:
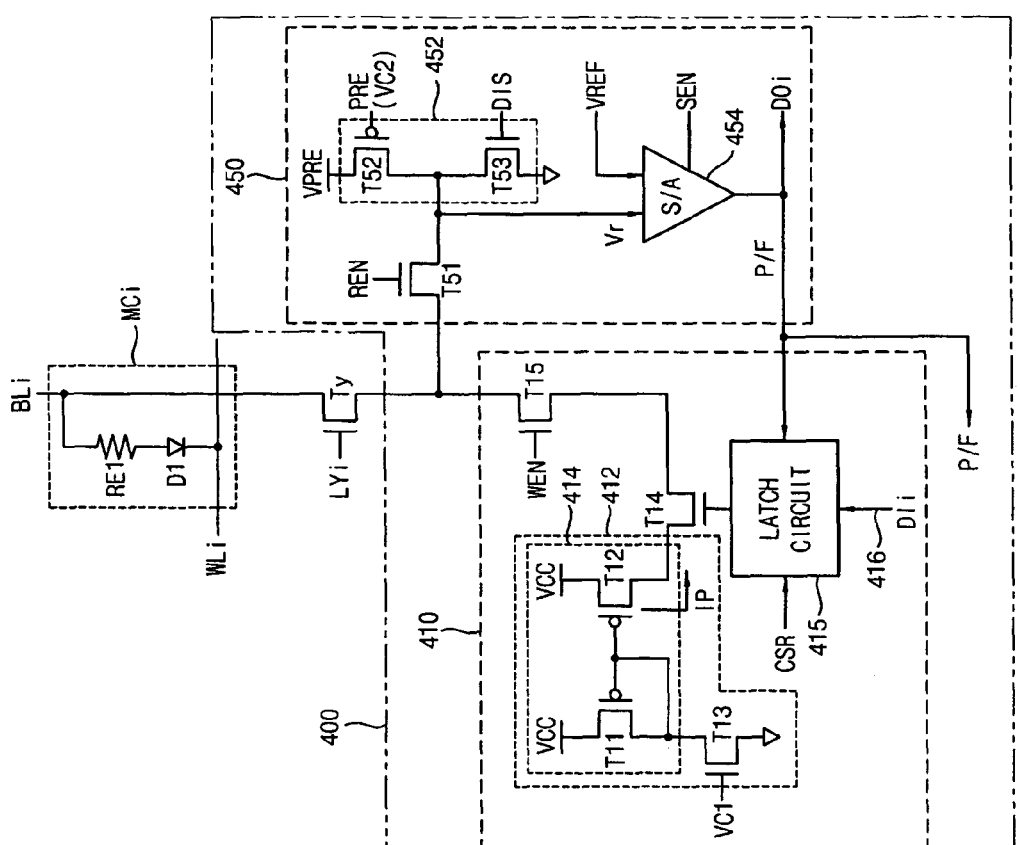
FIG. 9 illustrates an input/output block for use with a particular memory cell in accordance with an embodiment.

A schematic diagram of the I/O block 400 is illustrated in FIG. 9. The timing control signals may include a write enable signal (WEN), a read enable signal (REN), a sense enable signal (SEN), a precharge signal (PRE), and a discharge signal (DIS). Voltage control signals may includes a supply voltage (VCC), a precharge voltage (VPRE), and first and second voltage signals to the pulse generator 610 configured to generate voltage pulses VC1 and VC2. These voltages are then supplied to the I/O block 400.

The I/O block 400 may include a write driver 410 and a sense amplifier 450. The I/O block 400 may be connected to a memory cell MCi of the memory cell array 10 through a bitline selection transistor Ty, which is controlled by an address signal ADDY, i.e., Lyi. There are numerous such bit line selection transistors Ty in the column decoder 120. The I/O block 400 may be configured for use with a particular design of the memory cells MC, which includes a resistive element RE1 and a diode D1. Details of such a memory cell may be found, for example, in U.S. Pat. No. 7,427,531, which is hereby incorporated by reference in its entirety. A first terminal of the resistive element RE1 may be connected to the bit line BL, a second terminal of the resistive element RE1 may be connected in series with a first terminal of the diode D1, and a second terminal of the diode D1 may be connected to the wordline WL.

The write driver 410 may include transistors T11, T12, T13, T14, T15, and a latch circuit 415. The transistors T11, T12, T13 may form a pulse provider 412 receiving the supply voltage VCC. The transistors T11 and T12 may form a current mirror 412. The transistor T13 may be controlled by the voltage VC1. The latch circuit 415 may receive data to be written through data line 416 Dli and may control the state of the transistor T14 in accordance with the data from the data line 416 and a control signal register (CSR). The transistor T15, coupling the write driver 410 to the bit line selection transistor Ty, is controlled by the write enable signal (WEN).

The sense amplifier 450 may include a precharge circuit 452, including transistors T52 and T53 in series, a comparator 454, and transistor T51. A first terminal of the transistor T52 may receive the precharge voltage VPRE and a second terminal thereof may be connected to a first terminal of the transistor T53. The transistor T52 may be controlled by the precharge signal PRE. The transistor T53 may be controlled by the discharge signal DIS and may have a second terminal thereof connected to ground. The comparator 454 may compare a read voltage Vr with a reference voltage VREF and output the result as pass or fail signal (P/F). The transistor T51, coupling the sense amplifier 450 to the bit line selection transistor Ty, may be controlled by the read enable signal (REN).

During writing of the memory cell MCi, the write enable signal WEN is high, the address signal Lyi is high, and VC1 is high. Therefore, the transistor T13 is turned ON and a current pulse Ip is generated and output from the current mirror 414 through the transistor T15 to the resistance element RE1 of the memory cell MCi. When the control signal register is a low resistance program, e.g., VC1 is Vset, when the data signal is "0", the transistor T14 is on and, when the data signal is "1", the transistor T14 is OFF. When the control signal register is a high resistance program, e.g., VC1 is Vreset, when the data signal is "0", the transistor T14 is ON and, when the data signal is "1", the transistor T14 is OFF.

During reading of the memory cell MCi, the read enable signal REN is high and the address signal Lyi is high. When the discharge signal DIS is high, the transistor T53 is on and the bitline BLi is coupled to ground. When VC2 is low, transistor T52 is ON and the bitline BLi is coupled to the precharge voltage VPRE. The comparator 454 compares the read voltage Vr and the reference voltage VREF and outputs a data signal. During normal read operation, the data signal is supplied to outside the I/O block 400, i.e., to data output line DOi. During verify read operation, a pass/fail signal P/F is supplied to the latch circuit 415 of the write driver 410 and to the voltage generator 600. When the pass/fail signal is F, VC1 from the pulse generator 610 may be altered, e.g., increased. Thus, the current pulse Ip from the write driver 410 may be altered, e.g., increased. When the pass/fail signal is P, the latch circuit 415 may stop the write operation by turning OFF the transistor T14, regardless of the input data on the data line Dli.

Figure 10:
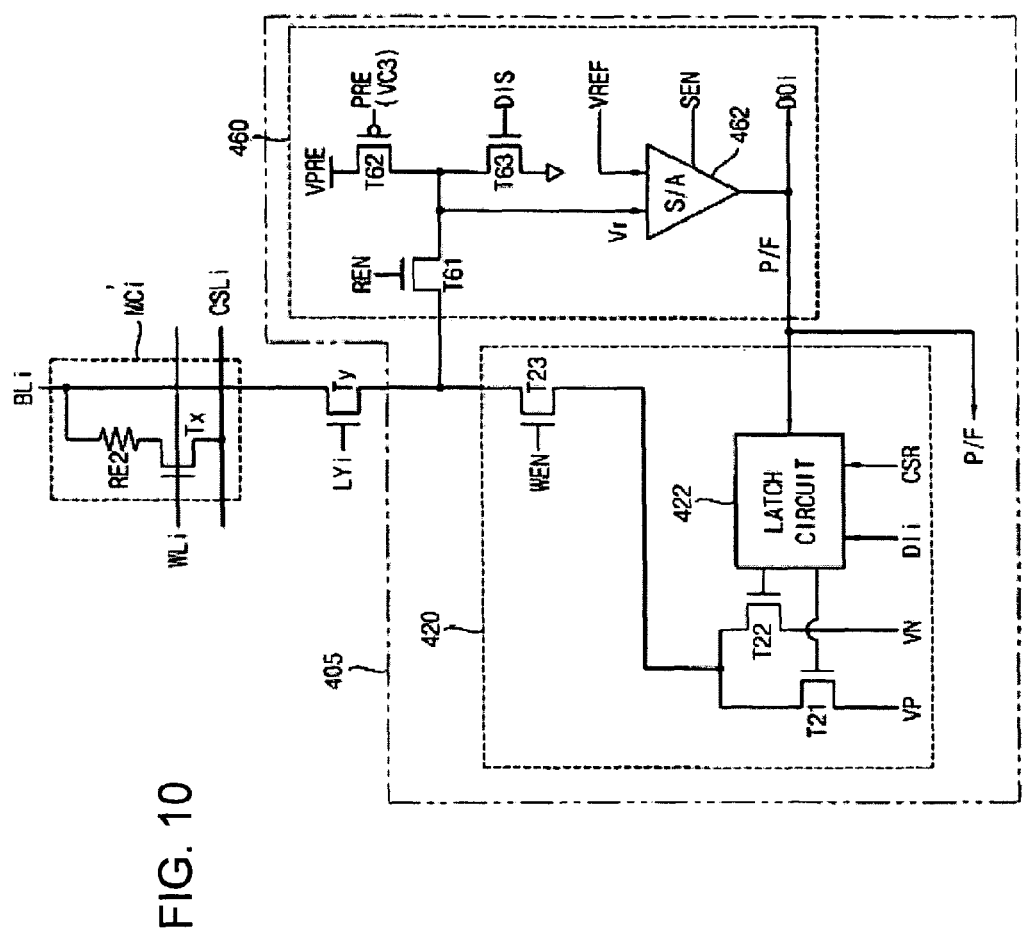
FIG. 10 illustrates an input/output block for use with a particular memory cell in accordance with an embodiment.

FIG. 10 illustrates schematic diagram of an I/O block 405 in an alternative embodiment. The I/O block 405 may include a write driver 420 and a sense amplifier 460. The I/O block 405 is connected to memory cells MCi' of the memory cell array 10 through a bitline selection transistor Ty, which is controlled by an address signal ADDY, i.e., Lyi. The I/O block 405 is configured for use with a particular design of the memory cells MC', which includes a resistive element RE2 and a transistor T1. A first terminal of the resistive element RE2 may be connected to the bit line BL, a second terminal of the resistive element RE1 may be connected in series with a first terminal of the transistor T1, a control terminal of the transistor T1 may be connected to the wordline WL, and a second terminal of the transistor T1 may be connected to a common source line CSL.

The write driver 420 may include transistors T21, T22, T23, and a latch circuit 422. The transistor T21 may receive a positive voltage Vp at the first terminal thereof to program an ON or set state. The transistor T22 may receive a negative voltage Vn at a first terminal thereof to program an OFF or reset state. The latch circuit 422 may control the transistors T21 and T22 in accordance with the data line signal Dli and the control signal register (CSR).

During writing of the memory cell MCi', the write enable signal WEN is high and the address signal Lyi is high. When the control signal register CST is a low resistance program, e.g., Vp is to be used, the latch circuit 422 turns the transistor T22 OFF. When the data signal is "0", the latch circuit 422 turns the transistor T21 ON and, when the data signal is "1", the latch circuit 422 turns the transistor T21 OFF. When the control signal register CSR is a high resistance program, e.g., Vn is to be used, the latch circuit 422 turns the transistor T21 OFF. When the data signal is "0", latch circuit 422 turns the transistor T22 ON and, when the data signal is "1", latch circuit 422 turns the transistor T22 OFF.

The latch circuit 422 turns the transistor T21 ON and, when the data signal is "1", the transistor T14 is OFF. When the control signal register CSR is a high resistance program, e.g., VC1 is Vreset, when the data signal is "0", the transistor T14 is ON and, when the data signal is "1", the transistor T14 is OFF.

The sense amplifier 460 may include transistors T61, T62, T63, and a comparator 462. The operation of the sense amplifier 460 and the relationship of the elements therein is the same as the sense amplifier 450 of FIG. 8, and details thereof are not repeated.

Figure 11:
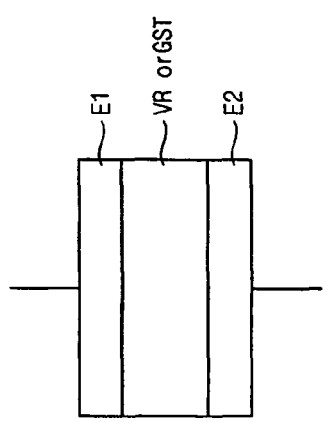
FIGS. 11 and 12 illustrate specific examples of resistive devices that may be used with embodiments.
Figure 12:
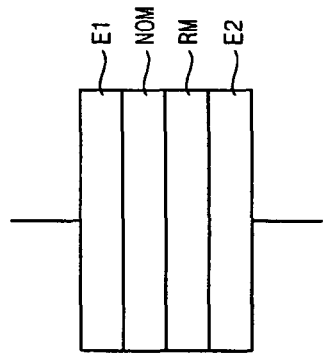

FIGS. 11 and 12 illustrate different types of resistors that may be generally employed with either memory cell configurations illustrated in FIGS. 8 and 10, e.g., a resistor in series with a diode or a transistor. As illustrated in FIG. 11, a resistor may be a unipole resistor including a top electrode E1, a bottom electrode E2, and a negative differential resistive material (NDR) or a chalcogenide material between the top and bottom electrodes. For NDR materials, Rreset>Rset and Vreset<Vset. For other chalcogenide materials, Rreset>Rset and Vreset>Vset. As illustrated in FIG. 12, a resistor may be a bipolar resistor including a nonohmic material NOM, e.g., a metal oxide, and a resistive material RM, e.g., a transition metal oxide, between the top and bottom electrodes E1 and E2. In the bipolar resistor, the memory state is controlled by the polarity of the voltage applied to E1 and E2. In other words, in one memory state, Ve1>Ve2 and in the other Ve1<Ve2.

As noted above, embodiments are not limited to PRAM devices, but may be employed with other resistive memory cells, e.g., RRAM, MRAM, etc. Details of such memory cells may be found, for example, in U.S. Pat. Nos. 6,545,906, 6,646,912, 6,849,891, 7,031,188, and 7,282,756, all of which are hereby incorporated by reference in their entirety.

While the above program methods have illustrated a continuous write method, i.e., all memory cells for the wordline are programmed before verify read operation is performed, the above program methods may be adapted to employ a suspend write method, as set forth, for example, in U.S. Pat. No. 7,535,747 or a suspend program method, as set forth, for example, in U.S. Patent Application No. 2008/0056023, both of which are hereby incorporated by reference in their entirety.

When storing data in two-level memory cells, each memory cell may be placed in one of four states associated with data values 11, 10, 00, and 01, each of which correspond to unique threshold voltage/resistance distributions. Constituent threshold voltage distributions should be closely controlled to allow each of the threshold voltage distributions to coherently exist within a defined threshold voltage window.

One control method successfully employed to accomplish this goal is a programming method commonly referred to as the incremental step pulse programming (ISPP) scheme as set forth, for example, in co-pending U.S. patent application Ser. No. 12/461,036, filed Jul. 30, 2009, which is hereby incorporated by reference in its entirety. According to the ISPP scheme, a programmed threshold voltage may be moved by defined increments with respect to a given threshold voltage distribution using sequence of program loops. Smaller ISPP programming increments generally allow more accurate definition of a threshold voltage distribution. Careful control of respective threshold voltage distributions allows better voltage margin definitions between data states. However, smaller ISPP programming increments also extend the amount of time required to program a memory cell to a desired state, and longer data programming cycles are generally undesirable. Accordingly, the size of ISPP programming increments must be weighed against programming time. Thus, the reduction in programming time in accordance with embodiments may be particularly useful for programming using ISPP.

Alternatively, embodiments may be used with other programming methods as set forth, for example, in U.S. Patent Application Publication Nos. 2008/0123389, which is hereby incorporated by reference in its entirety.

Figures 13, 14:
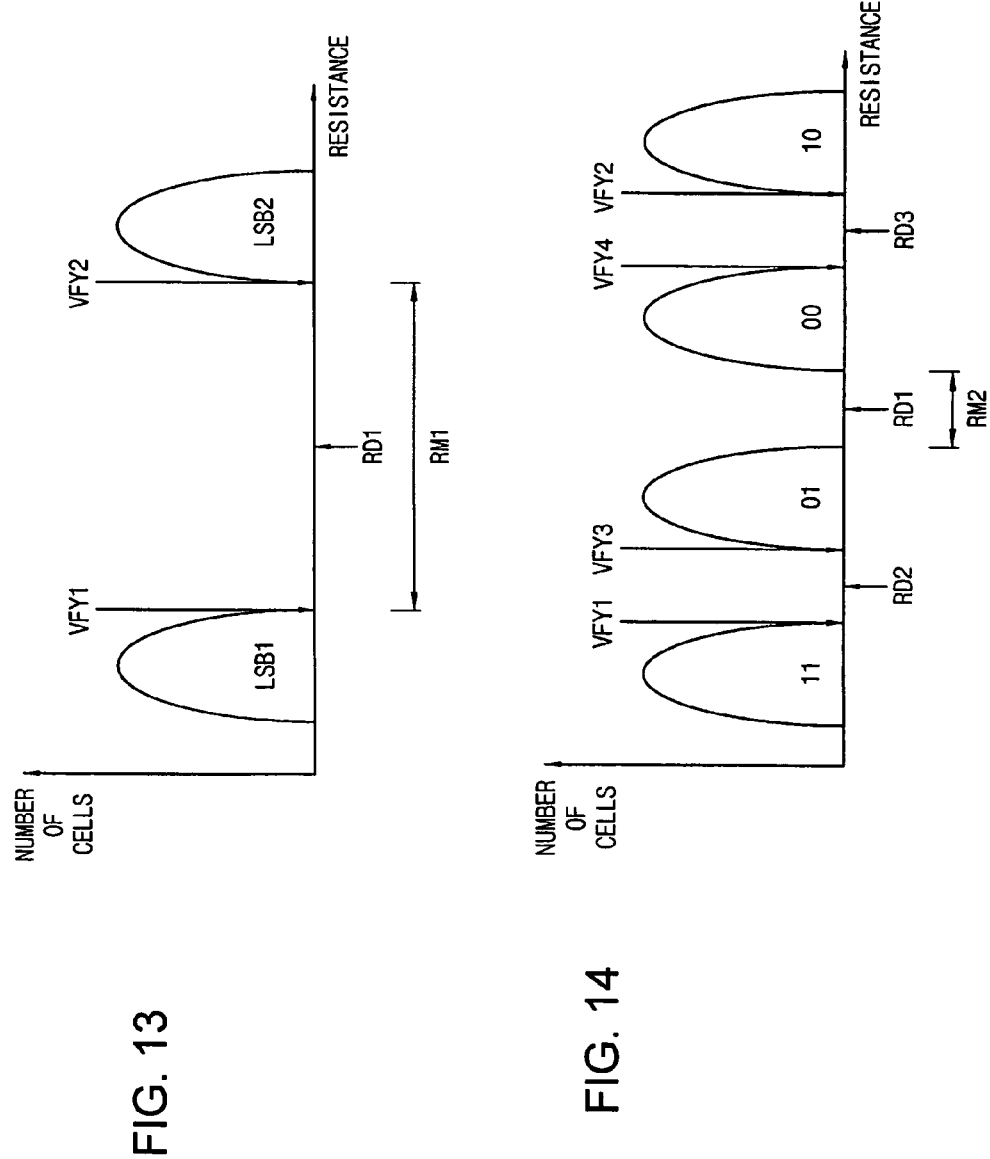
FIGS. 13 and 14 illustrate resistance distributions of different data states according to an embodiment.

FIGS. 13 and 14 illustrate why programming LSBs before programming next significant bits of multi-level cells in accordance with embodiments results in reduced program and read time. As illustrated in FIG. 12, when data is programmed to a LSB of a multi-level cell, the read margin RM1 is large and only one read voltage RD1 is needed. In contrast, when writing to a next bit, here MSB, in a multi-level cell, a plurality of read voltages are needed and the read margin RM2 is much smaller. Therefore, it takes a lot more time to perform an MSB read operation than a LSB read operation. Thus, in accordance with embodiments, programming time may be reduced by programming to LSBs of all two-level cells before programming to MSBs of any two-level cell.

Figure 15:
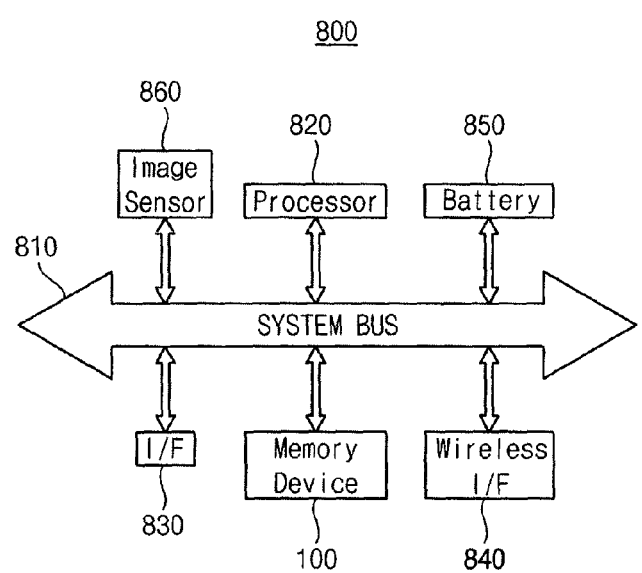
FIG. 15 illustrates a block diagram of a semiconductor system.

FIG. 15 illustrates a block diagram of a memory system 800 including a semiconductor device according to an exemplary embodiment of the present inventive concept. Referring to FIGS. 1 and 16, the memory system 800, e.g., a computer, may include the memory device 10 and a processor 820 connected to a system bus 110.

The processor 820 may generally control the write operation, the read operation, or the verify read operation of the memory device 100. For example, the processor 820 outputs write data and a command to control the write operation of the memory device 100. Also, the processor 820 may generate a command to control the read operation or the verify read operation of the semiconductor device 10. Thus, the control block (50 in FIG. 6) of the memory device 100 may perform the verify read operation, the program operation, or the write operation in response to the control signal output from the processor 820.

When the memory system 800 is implemented as a portable application, the memory system 800 may further include a battery 850 for supplying operation power to the memory device 100 and the processor 820. The portable application includes portable computers, digital cameras, personal digital assistants (PDAs), cellular telephones, MP3 players, portable multimedia players, automotive navigation systems, memory cards, smart cards, game consoles, electronic dictionaries, or solid state discs.

The memory system 800 may further include an interface I/F 830 for exchange of data with an external data processing device. When the semiconductor system 800 is a wireless system, the memory system 800 may further include a wireless interface I/F 840. In this case, the wireless interface 840 may be connected to the processor 820 to wirelessly exchange data with an external wireless device (not shown) via the system bus 810. For example, the processor 820 may process the data input through the wireless interface 840 and store the processed data in the memory device 100, or read out the data from the memory device 100 and transmit the read data to the wireless interface 840.

The wireless system may be a wireless device such as PDAs, portable computers, wireless telephones, pagers, or digital cameras, radio-frequency identification (RFID) readers, or RFID systems. Also, the wireless system may be wireless local area network (WLAN) systems or wireless personal area network (WPAN) systems. Also, the wireless system may be a cellular network.

When the memory system 800 is an image pick-up device, the memory system 800 may further include an image sensor 860 for converting an optical signal to an electric signal. The image sensor 860 may be an image sensor using a charge coupled device (CCD) or a complementary metal-oxide semiconductor (CMOS) image sensor manufactured using a CMOS process. In this case, the memory system 100 may be a digital camera or a cellular telephone having a digital camera function. Also, the memory system 800 may be an artificial satellite system to which a camera is attached.

Thus, in accordance with embodiments, by simultaneously activating more than one memory cell and/or by determining a pass/fail status on an individual memory cell basis, programming speed of a resistive memory device may be increased.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of writing data to a nonvolatile memory device having a plurality of multi-level memory cells, the plurality being at least two, the method comprising:
    writing a least significant bit for each multi-level memory cell of the plurality of memory cells; and
    after the least significant bit has been written for each multi-level memory cell of the plurality of memory cells, writing a next significant bit for each multi-level memory cell.

2. The method as claimed in claim 1, wherein the multi-level memory cells have more than two levels, finishing writing of all lower bits before writing higher bits, such that a most significant bit is written after all other bits have been written.

3. The method as claimed in claim 1, wherein, where "a" is a number of the plurality of multi-level memory cells, writing includes mapping logical addresses of data to a first through an a-th physical address corresponding to the least significant bits of the plurality of multi-level memory cells.

4. The method as claimed in claim 3, wherein, after the a-th physical address has been written, writing includes mapping logical addresses of data to an (a+1)th through an (2a) physical address corresponding to next significant bits of the plurality of multi-level memory cells.

5. The method as claimed in claim 4, wherein writing a most significant bit for n-level memory cells includes mapping logical addresses of data to an (a(n−1)+1)th through an (na) physical address corresponding to most significant bits of the plurality of multi-level memory cells.

6. The method as claimed in claim 1, wherein a distribution value of the least significant bit is higher than a distribution value after writing the next significant bit.

7. The method as claimed in claim 1, wherein the plurality of multi-level memory cells is a subset of all multi-level memory cells in the non-volatile memory device.

8. The method as claimed in claim 7, wherein the subset is completely written before other multi-level memory cells are written.

9. A multi-level non-volatile memory device, comprising:
    a plurality of multi-level memory cells, the plurality being at least two; and
    a controller configured to write a least significant bit for each multi-level memory cell of the plurality of multi-level memory cells and, after the least significant bit has been written for each multi-level memory cell of the plurality of multi-level memory cells, to write a next significant bit for each multi-level memory cell.

10. The device as claimed in claim 9, wherein each multi-level memory cell is a variable resistive memory cell.

11. The device as claimed in claim 10, wherein the variable resistive memory cell is a phase change memory cell.

12. The device as claimed in claim 11, wherein each phase change memory cell includes a cell diode.

13. The device as claimed in claim 9, wherein the plurality of multi-level memory cells is a subset of all multi-level memory cells in the non-volatile memory device.

14. The device as claimed in claim 13, wherein the subset is completely written before other multi-level memory cells are written.

15. The device as claimed in claim 9, wherein the multi-level cell has more than two levels, the controller is configured to finish writing of all lower bits before writing higher bits, such that a most significant bit is written after all other bits have been written.

16. The device as claimed in claim 9, wherein, where "a" is a number of the plurality of multi-level memory cells, the controller is configured to map logical addresses of data to a first through an a-th physical address corresponding to the least significant bits of the plurality of multi-level memory cells.

17. The device as claimed in claim 16, wherein, when the multi-level memory cells are n-level memory cells, the controller is configured to map logical addresses of data to an (a(n−1)+1)th through an (na) physical address corresponding to most significant bits of the plurality of n-level memory cells.

18. A system, comprising:
    a processor; and
    a multi-level non-volatile memory device coupled to the processor, including:
        a plurality of multi-level memory cells, the plurality being at least two; and
        a controller configured to write a least significant bit for each multi-level memory cell of the plurality of multi-level memory cells and, after the least significant bit has been written for each multi-level memory cell of the plurality of multi-level memory cells, to write a next significant bit for each multi-level memory cell.

19. The system as claimed in claim 18, wherein, where "a" is a number of the plurality of multi-level memory cells, the controller is configured to map logical addresses of data to a first through an a-th physical address corresponding to the least significant bits of the plurality of multi-level memory cells.

20. The system as claimed in claim 19, wherein the controller is configured to map logical addresses using a translation layer.

* * * * *